(12) United States Patent
Zine-El-Abidine

(10) Patent No.: US 10,162,120 B2
(45) Date of Patent: Dec. 25, 2018

(54) WAFER-LEVEL FIBER TO COUPLER CONNECTOR

(71) Applicant: CANADIAN MICROELECTRONICS CORPORATION, Kingston (CA)

(72) Inventor: Imed Zine-El-Abidine, Kingston (CA)

(73) Assignee: Canadian Microelectronics Corporation, Kingston (CA)

( * ) Notice: Subject to any disclaimer, the term of this patent is extended or adjusted under 35 U.S.C. 154(b) by 70 days.

(21) Appl. No.: 14/778,803

(22) PCT Filed: Mar. 19, 2014

(86) PCT No.: PCT/CA2014/050296
§ 371 (c)(1),
(2) Date: Sep. 21, 2015

(87) PCT Pub. No.: WO2014/146204
PCT Pub. Date: Sep. 25, 2014

(65) Prior Publication Data
US 2016/0047990 A1     Feb. 18, 2016

Related U.S. Application Data

(60) Provisional application No. 61/804,453, filed on Mar. 22, 2013.

(51) Int. Cl.
*G02B 6/30*     (2006.01)
*G02B 6/124*    (2006.01)
(Continued)

(52) U.S. Cl.
CPC ............. *G02B 6/305* (2013.01); *G02B 6/124* (2013.01); *G02B 6/132* (2013.01); *G02B 6/30* (2013.01);
(Continued)

(58) Field of Classification Search
CPC .. G03F 7/20; G02B 6/34; G02B 6/132; G02B 6/305; G02B 6/3656; G02B 6/3885
(Continued)

(56) References Cited

U.S. PATENT DOCUMENTS 4,181,400 A * 1/1980 Malsot ................. G02B 6/3838
                                                          385/83
4,329,190 A    5/1982 Berg et al.
(Continued)

OTHER PUBLICATIONS

International Patent Application No. PCT/CA2014/050296, International Preliminary Report on Patentability dated Oct. 1, 2015.
(Continued)

*Primary Examiner* — Akm Enayet Ullah
(74) *Attorney, Agent, or Firm* — Borden Ladner Gervais LLP

(57) ABSTRACT

A wafer-level technique to couple an optical fiber to an integrated photonic circuit is presented. A connector is fabricated on top of a substrate. The connector comprises hollow structures with high aspect ratio. The connector receives an optical fiber or a ribbon of optical fibers for connection to the integrated photonic circuit. The connector is made with a certain angle to achieve optimal coupling. The base of connector is aligned to a coupler on the substrate. Light can propagate in both directions from the fiber to the chip or from the chip to the fiber.

9 Claims, 12 Drawing Sheets

(51) Int. Cl.
  *G02B 6/132* (2006.01)
  *G02B 6/34* (2006.01)
  *G02B 6/36* (2006.01)
  *G02B 6/38* (2006.01)
  *G03F 7/20* (2006.01)
  *G02B 6/138* (2006.01)

(52) U.S. Cl.
  CPC ............ *G02B 6/34* (2013.01); *G02B 6/3656* (2013.01); *G02B 6/3885* (2013.01); *G03F 7/20* (2013.01); *G02B 6/138* (2013.01)

(58) Field of Classification Search
  USPC ..... 385/14–16, 37, 43, 47, 49; 430/311, 315
  See application file for complete search history.

(56) References Cited

U.S. PATENT DOCUMENTS

| | | | |
|---|---|---|---|
| 4,744,623 A | 5/1988 | Prucnal et al. | |
| 4,931,120 A * | 6/1990 | Christoff | B24C 1/04 |
| | | | 156/153 |
| 4,933,728 A * | 6/1990 | Fukuzawa | B82Y 20/00 |
| | | | 257/13 |
| 5,033,812 A | 7/1991 | Yoshida et al. | |
| 6,546,182 B2 | 4/2003 | Calvet et al. | |
| 6,798,953 B1 | 9/2004 | Cohen et al. | |
| 6,862,388 B2 | 3/2005 | Lam | |
| 7,162,124 B1 | 1/2007 | Gunn, III et al. | |
| 7,536,066 B2 * | 5/2009 | Kato | G02B 6/12004 |
| | | | 385/14 |
| 7,538,358 B2 * | 5/2009 | Badehi | G02B 6/3897 |
| | | | 257/98 |
| 7,590,326 B2 * | 9/2009 | Fincato | G02B 6/12002 |
| | | | 216/24 |
| 7,982,205 B2 * | 7/2011 | Wang | H01L 33/0079 |
| | | | 257/103 |
| 8,043,877 B2 * | 10/2011 | Badehi | G02B 6/10 |
| | | | 438/29 |
| 8,445,940 B2 * | 5/2013 | Tsai | H01L 29/7848 |
| | | | 257/190 |
| 8,891,919 B2 * | 11/2014 | Shiraishi | G02B 6/322 |
| | | | 385/15 |
| 8,921,681 B2 * | 12/2014 | Raymond | H01L 31/0547 |
| | | | 136/246 |
| 9,791,641 B2 * | 10/2017 | Heck | G02B 6/26 |
| 2003/0034438 A1 | 2/2003 | Sherrer et al. | |
| 2003/0235372 A1 * | 12/2003 | Schott | G02B 6/4248 |
| | | | 385/60 |
| 2009/0290837 A1 * | 11/2009 | Chen | G02B 6/34 |
| | | | 385/37 |
| 2010/0092128 A1 * | 4/2010 | Okayama | G02B 6/102 |
| | | | 385/14 |
| 2011/0216999 A1 * | 9/2011 | Choi | G02B 6/43 |
| | | | 385/14 |
| 2015/0212277 A1 * | 7/2015 | Guidotti | G02B 6/3636 |
| | | | 385/52 |

OTHER PUBLICATIONS

International Patent Application No. PCT/CA2014/050296, International Search Report dated Jul. 17, 2014.

* cited by examiner

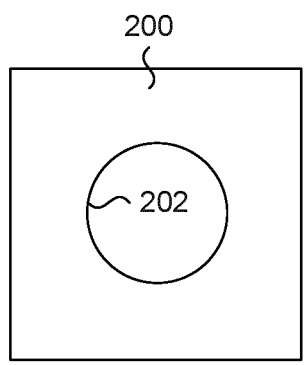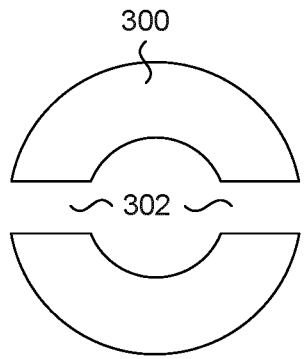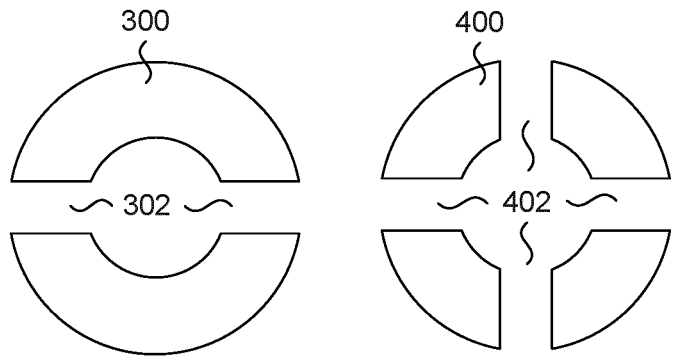
FIG. 3A  FIG. 3B  FIG. 3C
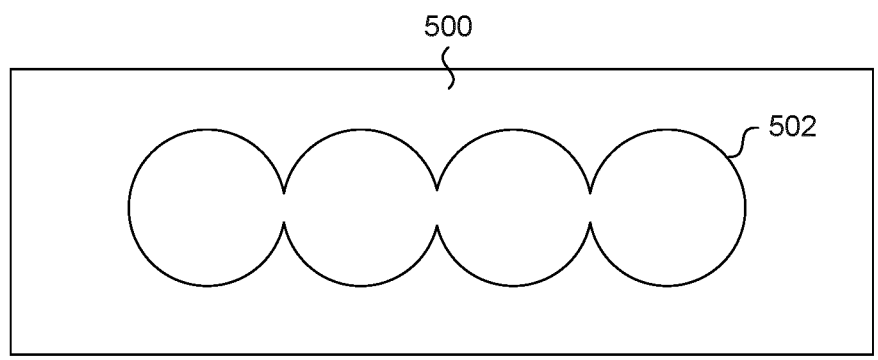
FIG. 4

WAFER-LEVEL FIBER TO COUPLER CONNECTOR

CROSS REFERENCE TO RELATED APPLICATIONS

This application claims the benefit of priority of U.S. Provisional Patent Application No. U.S. Provisional Patent Appln No. 61/804,453, filed on Mar. 22, 2013, which is hereby incorporated by reference.

FIELD

The present invention relates to optical fiber connectors.

BACKGROUND

Modern communications systems rely on high-data rate servers, base stations and supercomputers. These communications systems can be connected by optical fiber or copper interconnects. Optical fiber interconnects have many advantages compared to copper interconnects, such as: lower loss, lower dispersion, lower cross talk and immunity to electromagnetic interference. In addition, the introduction of microelectronics-based fabrication processes using standard foundry equipment and fabrication steps for the manufacture of silicon photonics will lower the cost of photonic devices. Therefore, fiber optic link deployment is spreading to even the very short reach (VSR) category of systems. While optical fiber interconnects remain a preferred medium to transmit data between nodes, optical fiber links still continue to be more expensive than electrical links due to an expensive packaging step necessitated by optical systems. The challenge of connecting an optical fiber to a semiconductor chip causes the packaging-related expense.

There are many techniques to couple an optical fiber to a semiconductor chip. A first technique is the butt coupling method, which comprises connecting an optical fiber end to an edge of an integrated circuit waveguide. This technique has some limitations since it is only optimal when the cross-section of the waveguide is of similar size to the cross-section of the optical fiber. A size mismatch between the two cross-sections can lead to high signal power losses. The butt coupling method also limits the layout options on the chip since the optical fiber connections are at the edge of the chip. In some instances, a cleaving and a polishing step are added at the end of the butt coupling process, which adds time and expense to the packaging of optical fiber links.

A second technique is the vertical coupling method, which uses grating structures to couple light from a waveguide to an optical fiber. The grating coupler doesn't require any further processing, such as the cleaving and polishing described in butt coupling, and can achieve high coupling efficiency.

However, both types of coupling may require active alignment of the fiber to the waveguide. The Active alignment method relies on the continuous monitoring of the signal strength while attaching the fiber by a technician. This procedure is time intensive, sometimes taking about 60 minutes, which reduces the throughput assembly and increases the cost of the final package.

Some known methods of the prior art are detailed below.

U.S. Pat. No. 6,862,388 discloses the use of a fiber guiding layer (FBL) to avoid space consuming V-grooves, ferrule or fiber brackets. The goal is to increase the vertical coupling port density. The FBL has a funnel shape top to help guide the fiber. While a variety of materials that could be used to make the FBL are described, such as silicon dioxide, sol-gel or polyimide, no clear method of how to make the funnel shape is taught. Furthermore since the structure is vertical, a 45 degree mirror is required if a coupling to a waveguide is considered. Hence the coupling efficiency will be very low if the fiber is placed over a grating coupler.

U.S. Pat. No. 4,744,623 discloses a method of attaching a fiber to a detector on a substrate. The fiber is attached by placing it in an etched cavity and gluing the outside of the fiber cladding to an aluminum layer on top of the wafer with epoxy. The limitation with this technique is that the fiber can only positioned in a vertical manner.

U.S. Pat. No. 6,546,182 discloses a method of making an angled fiber termination. The support assembly consists of a substrate with a through via with a diameter wider than the fiber. A preload on one end of the fiber will result in an angle. The issue with this technique is that the angle heavily depends on many parameters such as the gap between the fiber diameter and the opening in the substrate, the thickness of the substrate and the preload force. The alignment of the termination is also not addressed in this disclosure.

U.S. Pat. No. 7,162,124 discloses a method to connect a fiber to an integrated circuit. The tip of the fiber is cut with an angle. The light reflects at the reflective surface of the angled tip through total internal reflection. This method heavily depends on the cleaving angle of the fiber tip, the alignment with respect to the grating and the roll angle of the fiber.

Therefore, there is a need for an improved connector and method for connecting an optical fiber to a semiconductor device.

SUMMARY

It is an object of the present disclosure to obviate or mitigate at least one disadvantage of previous optical optical fiber connectors.

In a first aspect, the present disclosure provides a semiconductor device comprising a substrate and a connector. The connector is formed on a surface of the substrate defining a bore extending from a top facet of the connector to the surface of the substrate. The connector bore has a shape for receiving an optical fiber. According to an embodiment of the present aspect, the substrate includes a first cladding layer upon which the connector extends from, a core layer under the first cladding layer, and a second cladding layer under the core layer. In this embodiment, the first cladding layer includes a grating coupler, and the bore of the connector is aligned over the grating coupler. According to another embodiment of the present aspect, the bore of the connector is tapered and an opening of the top facet has a diameter greater than an opening of the bore at the surface of the substrate. Furthermore, the connector has a height to width aspect ratio aspect ratio of at least 2:1.

According to another embodiment of the present aspect, the connector is formed at an angle relative to the surface of the substrate. The connector of this embodiment can be generally cylindrical in shape. The cylindrical connector can include two slots extending from the bore to an external wall of the bore. Alternately, cylindrical connector can include four slots extending from the bore to an external wall of the bore. Alternate to a cylindrical shape, the connector can be generally rectangular in shape. In yet another alternate embodiment, the connector is configured to receive an optical fiber ribbon. The connector can be constructed of polymer material or metal material.

In a second aspect, the present disclosure provides a method for fabricating a semiconductor device having an optical fiber connector. The method includes depositing a polymer over a surface of the semiconductor device; applying a patterning mask configured to form the connector with a predetermined shape for receiving an optical fiber, on the polymer; irradiating the polymer at an angle with a radiation source; and removing at least portions of the polymer to leave a connector formed at an angle relative to the surface. The semiconductor device can include an optical waveguide having a grating coupler. According to embodiments of the present aspect, applying the patterning mask includes aligning the patterning mask to form the connector over the grating coupler, irradiating can include angling the semiconductor device relative to the radiation source or angling the radiation source relative to the semiconductor device, and the radiation source can include X-Rays.

In another embodiment of the second aspect, irradiating includes applying a prism having predetermined dimensions over the patterning mask and directing the radiation at a direction perpendicular to the surface of the semiconductor device, where the radiation includes UV light. The polymer can have a height of at least 2 times a width of the connector. In one further embodiment, removing the polymer includes removing any polymer exposed to the radiation source, or alternately removing any polymer blocked from exposure to the radiation source. For this embodiment, a cavity having a shape corresponding to an inverted connector is formed in the polymer, which is subsequently filled with metal material.

In a third aspect, the present disclosure provides a method for automatic insertion of an optical fiber into an optical fiber connector. The method includes i) positioning the optical fiber connector on a work surface, where the optical fiber connector extends at an angle relative to a two-dimensional plane of the work surface; ii) controlling the motorized stage to align the optical fiber with a bore of the optical fiber connector in the two-dimensional plane; iii) controlling the motorized stage to move the optical fiber along a vector corresponding to the angle that intersects the two-dimensional plane; iv) detecting if the optical fiber has been inserted into the optical fiber connector; v) reducing a distance between the optical fiber and the optical fiber connector along a dimension orthogonal to the two-dimensional plane when the optical fiber has been detected as not being inserted into the optical fiber connector; and, vi) repeating ii), iii), iv) and v) until the optical fiber has been detected as being inserted into the optical fiber connector.

BRIEF DESCRIPTION OF THE DRAWINGS

FIGS. 3A, 3B and 3C are drawings of different optical fiber connector configurations, according to alternate embodiments;

FIG. 4 is a drawing of a optical fiber ribbon connector, according to a present embodiment;

DETAILED DESCRIPTION

The present disclosure provides a connector for a substantial vertical coupling of an optical fiber to waveguide, and a method of fabricating the connector. In an embodiment, the method further provides for fabricating the connector at the wafer-level, which allows for placement of an optical fiber on a chip with high alignment accuracy, low cost and in high volumes. This is opposed to chip level connection of the optical fiber, which occurs after the wafer has been diced. The advantage of wafer-level connecting is the realization of the structure at once over the whole wafer, resulting in time and cost savings.

Figure 1:
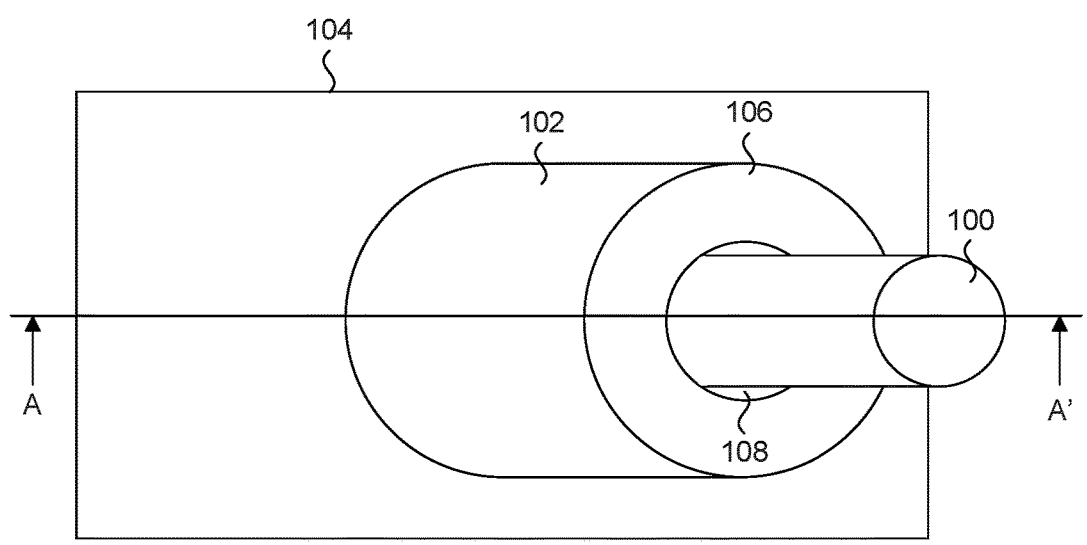
FIG. 1 is a top plan view of an assembly of optical fiber coupled to a semiconductor chip, according to a present embodiment.

FIG. 1 is a top plan view of an assembly of an optical fiber coupled to a semiconductor device or chip according to an embodiment of the present disclosure. The assembly of FIG. 1 shows an optical fiber 100 inside a connector 102 formed on a substrate 104 of a semiconductor structure, such as a semiconductor waveguide. The connector 102 is formed at an incline or angle relative to the plane of the substrate, and in the present embodiment, is cylindrical in shape. The connector 102 extends from the surface of substrate 104 and ends with a top facet 106. A cylindrical bore 108 extends from the top facet 106 to the surface of the substrate 104. As will be shown later, the bore 108 at the surface of the substrate 104 is aligned over a grating coupler of the waveguide.

Figure 2:
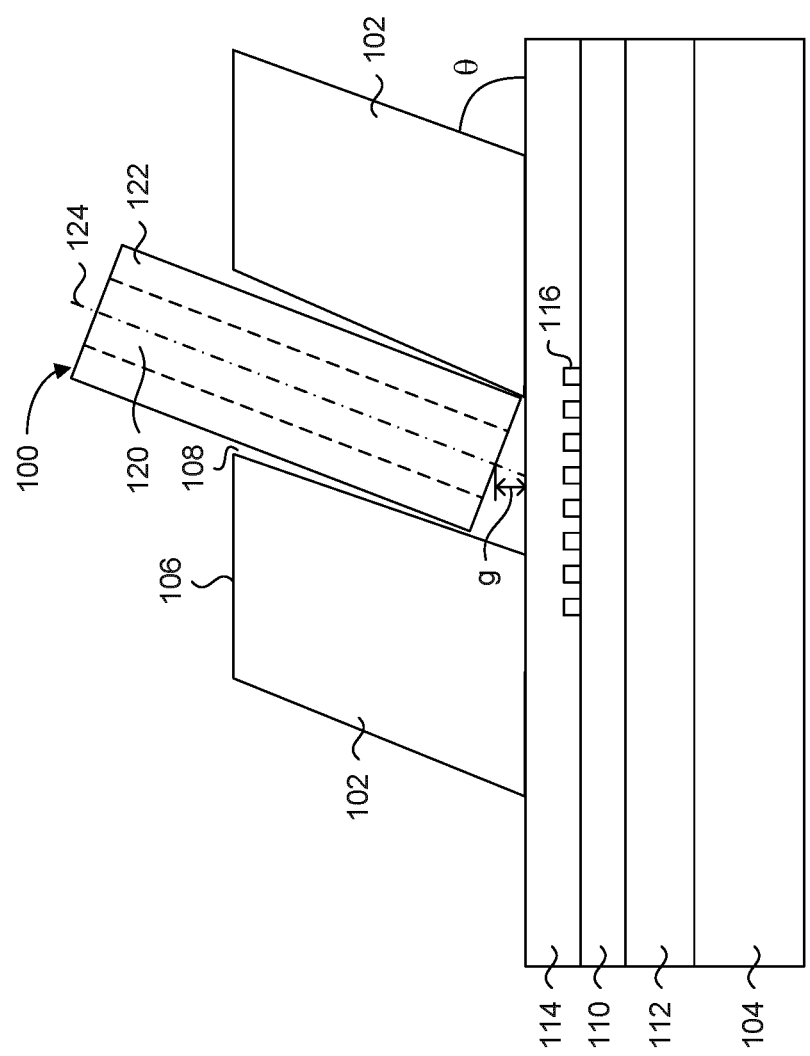
FIG. 2 is a side cross-section view of the assembly shown in FIG. 1 taken along line A-A'.

FIG. 2 is a side cross-section view of the assembly shown in FIG. 1 taken along line A-A', according to an embodiment of the present disclosure. In this embodiment, the semiconductor structure is an integrated circuit consisting of a waveguide, thus the substrate 104 is fabricated to have layers corresponding to the waveguide. In an embodiment, the chip integrates both optical and electrical functions. FIG. 2 shows only a portion of the semiconductor structure. The waveguide comprises a core 110 sandwiched by first and second cladding layers 112 and 114. It is noted that the second cladding layer 114 is optional in some embodiments. In an example of the present embodiment of FIG. 2, the chip is fabricated with silicon-on-insulator (SOI) substrates, wherein the core 110 is a silicon layer, the first cladding layer 112 is a buried oxide layer and the second cladding layer 114 is an optional oxide layer. Formed on the core layer 110 is a grating coupler 116 for coupling received light to the core layer 110. The SOI substrate is an exemplary illustration. Other examples of waveguides include silicon nitride on glass. Waveguide structures are known in the art, and therefore no further detailed description of these other structures is needed. Through a semiconductor fabrication process to be explained in further detail later, the optical fiber connector of the present disclosure can be applied to any type of substrate. A description of the optical fiber connector of the present embodiment now follows.

The connector 102 can be formed with a polymer such as polymethyl methacrylate (PMMA) or any other material that can be patterned using lithography. Example lithography methods include high exposure dose UV light lithography and X-ray lithography. While the overall structure of connector 102 is generally cylindrical in the present embodiment, as is clearly shown in FIG. 2, connector 102 is formed at an angle θ relative to the substrate surface. While not shown in the present example, the connector is formed to have a high aspect ratio. A high aspect ratio connector is understood to have height dimension larger than its width. A high aspect ratio connector will provide a better grasp or structural support for the inserted optical fiber. An aspect ratio of more than 2 is sufficient to hold the fiber, and greater aspect ratio connectors can be formed. It is noted that the aspect ratio should be selected to optimize structural integrity of the connector. This can be achieved by fabricating the walls of the connector to be as thick as possible. While the walls of connector 102 of FIGS. 1 and 2 substantially constant in thickness, an asymmetric cylinder structure can be formed where certain portions of the wall are wider, or thicker. For example, the portions of the external cylinder wall forming an acute angle with the substrate can be made wider.

According to a present embodiment, the connector 102 is fabricated at an angle θ to the plane of the cladding layer 114 using inclined exposure to fabricate the connector 102 directly on the cladding layer 114. Therefore, both the external an internal wall of the connector 102 are angled at about θ. The selected angle θ depends on the grating design. Most of the gratings are designed to tolerate a coupling angle between 0 and 35 degrees relative to a flat facet of an optical fiber. According to a present embodiment, due to the high aspect ratio of the connector 102, the bore 108 profile is overcut due to the exposure dose and the developing process, and therefore the diameter of the bore 108 is wider at the top facet 106 than at the interface with the second cladding layer 114. This facilitates insertion of the optical fiber into the connector 102.

Generally, optical fibers include a coating around the cladding. For the purposes of coupling to the connectors of the present embodiments, the fiber is prepared by stripping off this coating using wet etching techniques, such as by immersion into hot (200° C.) concentrated sulfuric acid. This stripping step does not affect the strength of the fiber. The stripping step will ensure a consistent fiber diameter as presented in the product specifications. For example a single mode fiber will have a diameter of 125 μm. The resulting stripped optical fiber 100 comprises a core 120 and a cladding 122 surrounding the core 120. The end of the fiber 100 for insertion into the connector 102 is cleaved with a tool to achieve a vertical facet to the axis 124 of the fiber 115. The connector 102 of the present embodiment can receive optical fibers with different terminations, such as tapered optical fibers or lensed optical fibers, as may be required by specific applications. In case the end of the optical fiber is tapered or rounded the penetration will be easier since the narrowing at the tip offers some guidance while inserting the fiber in the connector.

When the fiber 100 has a facet that is perpendicular to its axis 124 as shown in the embodiment of FIG. 2, one edge of the end of fiber 100 will abut the surface of the chip and prevent further insertion of the fiber 100. In this case, the center of the core 120 will be at a certain height 'g' from the chip (where $g=0.5 \times \emptyset \times \cos \theta$). In an embodiment, the gap is reduced by cleaving the fiber 100 at an angle complementary to θ in order to align the facet closely to the substrate surface. Other fiber termination type embodiments, such as tapered or lensed terminations, will achieve a lower gap to the surface of the chip. It is noted that an optical fiber cleaved to have a tapered end requires a proper roll angle to minimize the gap. However, a lensed fiber can be placed at any roll angle.

In operation, light coming through fiber 100 will enter the waveguide though a grating coupler 116. The center of the fiber core 120 should be placed at an optimal position relative to the grating coupler 116 to achieve the highest coupling efficiency. Connector 102 can be aligned to the grating coupler 116 using common alignment techniques known in lithography. In one example, alignment marks on an X-Ray mask superpose the alignment marks on the wafer.

In the present embodiment, the fiber 100 is secured in the connector 102 by applying any adhesive material between the fiber 100 and the connector 102. In the alternate embodiment wherein the connector 102 is fabricated in metal, a solder can be used to attach the fiber 100 to the connector 102. The fiber 100 can be inserted into the connector 102 either manually by a technician, or automatically by employing a robotic arm with grippers to perform the insertion action. The arm moves in three components of translation to align the fiber end to the opening of the connector 102. The robotic arm can include additional degrees of freedom, such as rotational components to rotate the fiber in case the fiber end is cleaved to have a taper. In order to manipulate the fiber 100 in an angled direction corresponding to the angled formation of connector 102, the arm is controlled to move in a planar direction and in a vertical (downward) motion concurrently. The grippers of the robotic arm will be used to hold the fiber during the insertion procedure. A consistent gripping force and handling procedure will prevent damage to the fiber. In another embodiment, during insertion of the fiber 100 into the connector 102, a real time camera system is used to assist a user interface and software. According to this method of inserting the fiber 100 into the connector 102, there is no need for active alignment of the center of the fiber core 120 to the grating coupler 116. Further details on the method for automatic fiber insertion into the connector embodiments of the present disclosure are described and shown later.

While the embodiment of the connector shown in FIG. 1 and FIG. 2 is substantially cylindrical in shape, alternate connector shapes can be formed and used for receiving an optical fiber. For example, the alternate embodiments of FIGS. 3A, 3B and 3C show different optical fiber connector configurations. These drawings show a top-down view of the general shape of the presently described alternate connectors. In FIG. 3A, the connector 200 is square or rectangular shaped instead of circular, and illustrates an example of connector walls having different dimensions or thicknesses. The connector could have any shape, square, hexagonal or any shape as long as it holds the fiber. From a side view, the connector of FIG. 3A would appear as a square shaped pillar. The bore 202 is sized to receive the previously shown stripped optical fiber. In FIG. 3B, the connector 300 is generally circular in shape, but includes a pair of slots 302 extending from the bore to the external walls of the connector 300. Therefore the connector 300 can be seen as two semicircular portions of a full circular connector. If the bore is a tight fit for the optical fiber to be inserted, the slots facilitate insertion of the optical fiber. FIG. 3C shows a connector 400 similar to that of FIG. 3B, except that four slots 402 extend from the bore to the external walls of the connector 400. Therefore the connector 400 can be seen as 4 arcuate portions of a full circular connector. For the embodiments of FIG. 3B and FIG. 3C, the slots help to reduce friction during the insertion procedure; this facilitates the insertion of the fiber into the connector. In the presently shown embodiments of FIGS. 3B and 3C, the slots are formed equidistantly from each other. In alternate embodiments, any number of slots of different sizes can be used, and they can be formed at any suitable distance from each other that does not sacrifice structural integrity of the connector walls.

These example alternate connector shapes can be fabricated in any shape since lithography allows for different patterning based on the mask used.

FIG. 4 shows an embodiment of a connector for an optical fiber ribbon. The ribbon connector 500 comprises a plurality of receptacles 502 for receiving optical fibers. The receptacles 502 function similarly to the high aspect-ratio connector 102 but are arranged to connect fibers in a ribbon configuration. In a further embodiment, grating couplers for the input and output optical signals are located at one edge of the chip and are connected to a ribbon fiber by ribbon connector 500. Additionally, connector 500 can be formed at an angle, similar to connector 102. In all the previously shown connector embodiments, the connector can be placed on any part of the chip.

Figure 5:
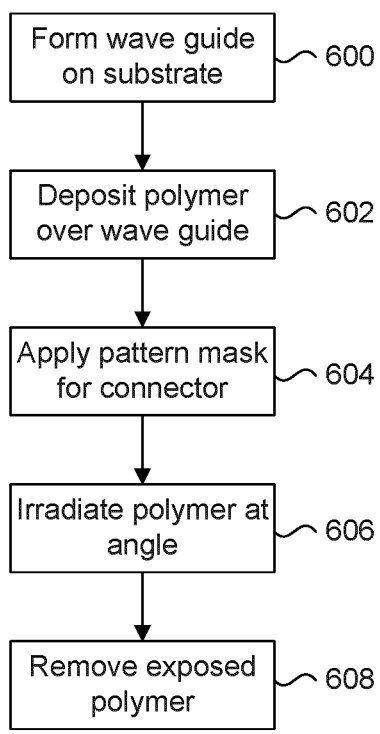
FIG. 5 is a flow chart of a method for forming a optical fiber connector, according to a present embodiment.

FIG. 5 is a flow chart of a method for forming an optical fiber connector, according to a present embodiment. The description of this method is made with reference to FIGS. 6A to 6D and FIGS. 7A to 7E. FIGS. 6A to 6D are cross sectional views showing the fabrication of a optical fiber connector on a semiconductor waveguide, according to one embodiment, while FIGS. 7A to 7D are cross sectional views showing the fabrication of a optical fiber connector on a semiconductor waveguide, according to an alternate embodiment.

Figure 6A:
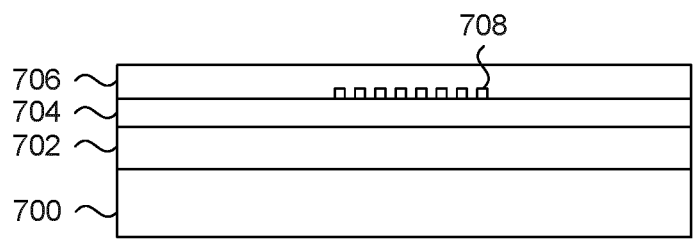
FIGS. 6A to 6D are cross sectional views showing the fabrication of a optical fiber connector on a semiconductor waveguide, according to one embodiment.
Figure 6B:
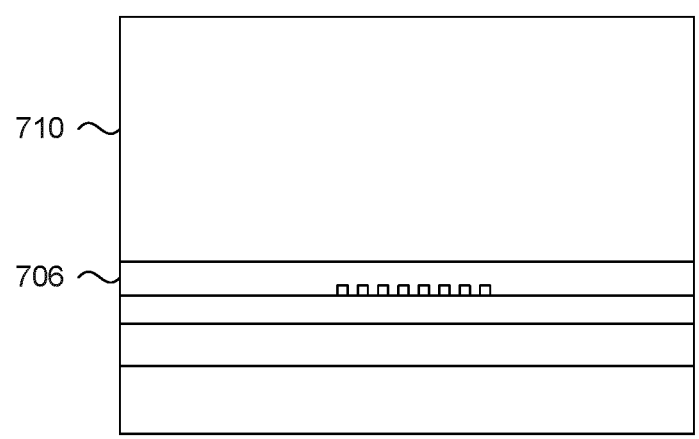
Figure 6C:
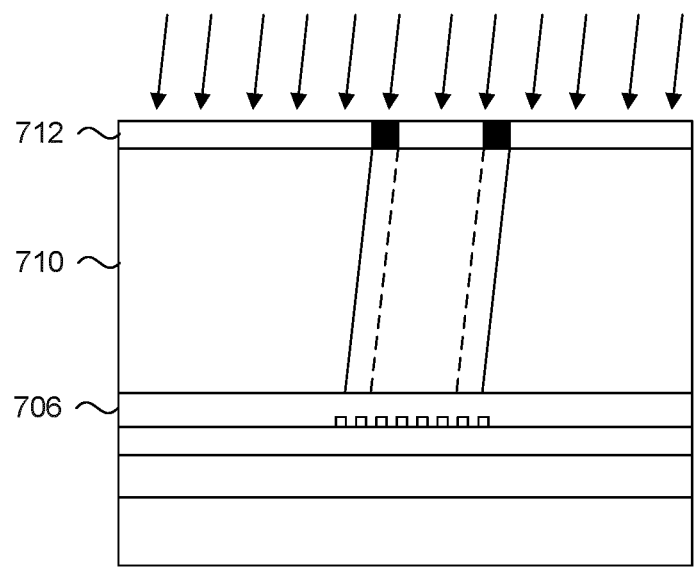
Figure 7A:
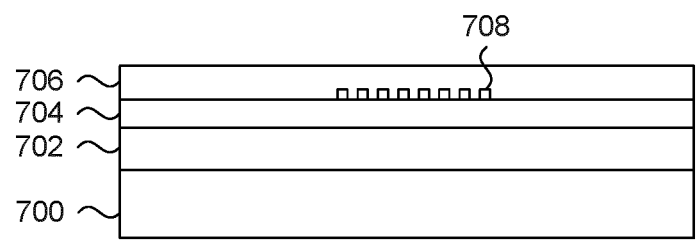
FIGS. 7A to 7E are cross sectional views showing the fabrication of a optical fiber connector on a semiconductor waveguide, according to an alternate embodiment.
Figure 7B:
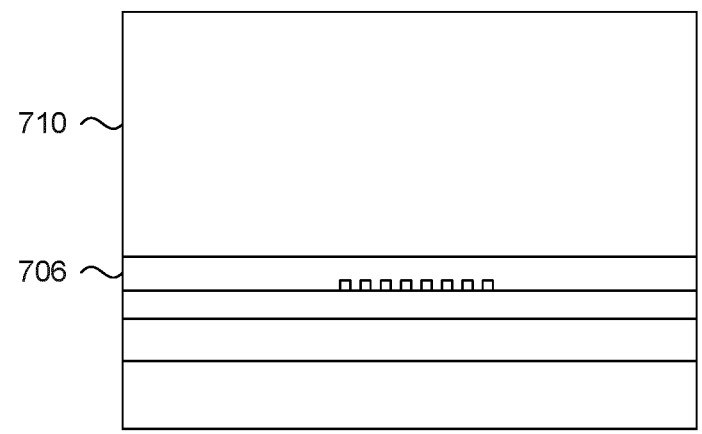
Figure 7C:
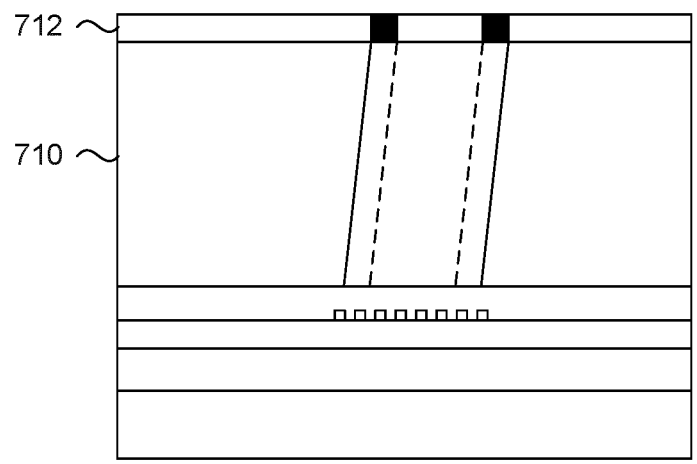

The method of FIG. 5 starts at 600 with formation of a waveguide on a semiconductor substrate, and includes formation of cladding layers, a core layer and grating coupler. FIGS. 6A and 7A show a substrate 700, first cladding layer 702, a core layer 704, a second cladding layer 706, and a grating coupler 708. These structures are the same as those shown in the embodiment of FIG. 2. At 602, a polymer is deposited over the region of the chip where the connector is to be formed. In FIGS. 6B and 7B, this is shown as polymer 710 formed over second cladding layer 706. At 604 a mask is applied over the top of the polymer, with a predetermined pattern for forming a connector structure. In the present example, it is assumed that the mask is patterned to form a cylindrical connector such as the one shown in the embodiment of FIG. 2. FIGS. 6C and 7C show such a patterned mask 712 formed on the top of polymer 710. The mask pattern is properly aligned so that the final connector structure is formed over the grating coupler.

Once the mask has been formed at 604, the chip is exposed to radiation at 606 such as UV light or X-rays, or any other source that the polymer exposed by the mask is reactive to. Those skilled in the art should understand that the exposed polymer structure is changed by the radiation source such that it can be easily removed in a subsequent step, while those parts of the polymer blocked by the mask are not. A unique aspect of the present process step 606 is that the mask receives the radiation at an angle. In the presently described example, a positive resist is used. Alternately, a negative resist can be used instead such that any regions covered by the dark part of the mask can be removed while exposed regions remain intact on the substrate.

In the embodiment of FIG. 6C, X-rays irradiate the mask 712 at an angle, where the irradiation angle is selected to result in a desired angle of the formation of the connector relative to the second cladding layer 706. For example, if the desired lean angle of the connector is to be θ, then the X-rays can be angled at θ relative to the surface of the mask 712. The X-ray source can be angled, or alternatively, the chip can be positioned at the suitable angle.

Figure 6D:
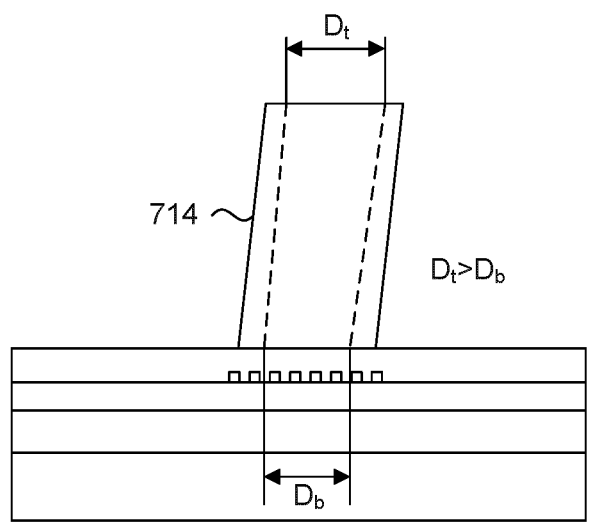
Figure 7D:
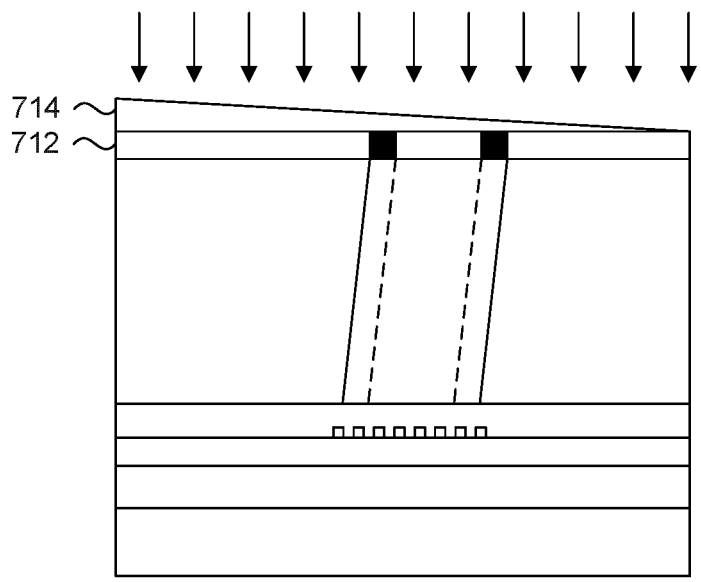
Figure 7E:
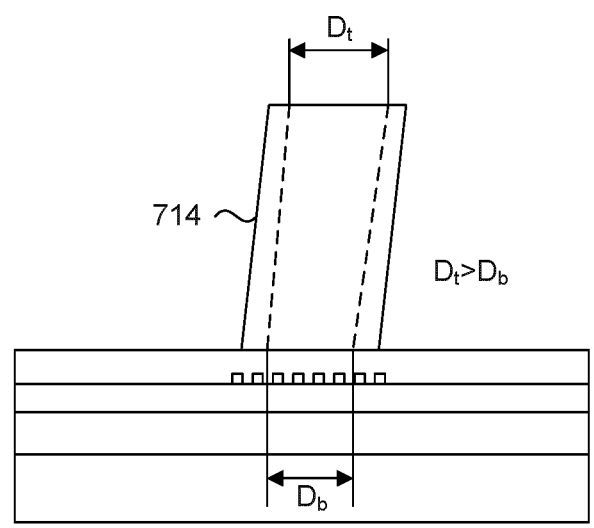

In the embodiment of FIG. 7D, UV light is used to irradiate the mask 712. While the UV light is directed perpendicular to the plane of mask 712, a prism 714 is formed on the surface of mask 712 for refracting the received UV light in an angled direction such that the mask receives UV light at an angle. The prism dimensions can be selected based on the index of refraction for achieving a connector having the desired lean angle. If desired, formation of the connector with smaller acute angles, can be done by combining a prism with an angled irradiation source. Returning to FIG. 5, the mask is removed and any polymer exposed to the radiation from 606 is removed by application of a solvent. In the embodiment of FIGS. 6D and 7E, the final connector structure 714 is shown after exposed polymer has been removed. It is noted that the bore of connector 714 has a tapered shape, where the opening or aperture at the top has a diameter Dt greater than the opening formed at the bottom Db. This effect is more pronounced as the aspect ratio of the connector is increased, ie. as the connector height is increased. This is due to the fact that the photoelectron doses at the surface are higher than the doses at lower depths, leading to sloped sidewalls.

The present embodiment illustrates a method for fabricating a connector out of polymer. In an alternate embodiment, the connector can be fabricated with metal by plating through a mold fabricated using lithography or a LIGA (Lithography, Galvanoformung, Abformung—Lithography, Electroplating, and Molding) process. It is noted that the angled connector can be formed in a similar fashion as previously described for the X-Ray lithography method to make the mold. The plating step is straightforward, and may be done at an inclined angle in the plating bath. With reference to the fabrication process of FIGS. 6A-6D, the same steps can be executed with the difference being that the mask 712 is a negative resist. Accordingly, a resulting cavity or mold in the polymer 710 having the inverted shape of the connector is formed once the material is etched away. Then the cavity is filled with metal, via the metal plating process by example. Once filled with metal, the surrounding polymer is removed, leaving behind the metal connector structure.

Once formed, the semiconductor connector can receive an optical fiber. According to a present embodiment, the optical fiber can be automatically inserted into any one of the previously shown connector embodiments, by using an automatic assembly system comprising an XYZ translation stage, a microscope attached to a real-time camera, and a computer workstation, where the translation stage includes a clamp and the stage can be controlled using a programmed computer workstation or other programmed computing device. In one embodiment, the motors of the translation stage are controlled by a program, such as LabVIEW for example running on the computer workstation. Therefore, all control of the stage is executed by the computer workstation. The automatic fiber insertion system of the present embodiment uses pattern recognition to determine local X-Y coordinates of a connector and the tip of a fiber held by the clamp, and moves the clamp in the required directions for inserting the fiber into the connector. The automated method requires minimum human interaction. The method executed by the system is shown in the flow chart of FIG. 8, and is now described with reference to FIGS. 9A and 9B. FIG. 9A is a top plan view of a motorized stage and optical fiber clamp, while FIG. 9B is a side view of the motorized stage and optical fiber clamp of FIG. 9A.

Figure 8:
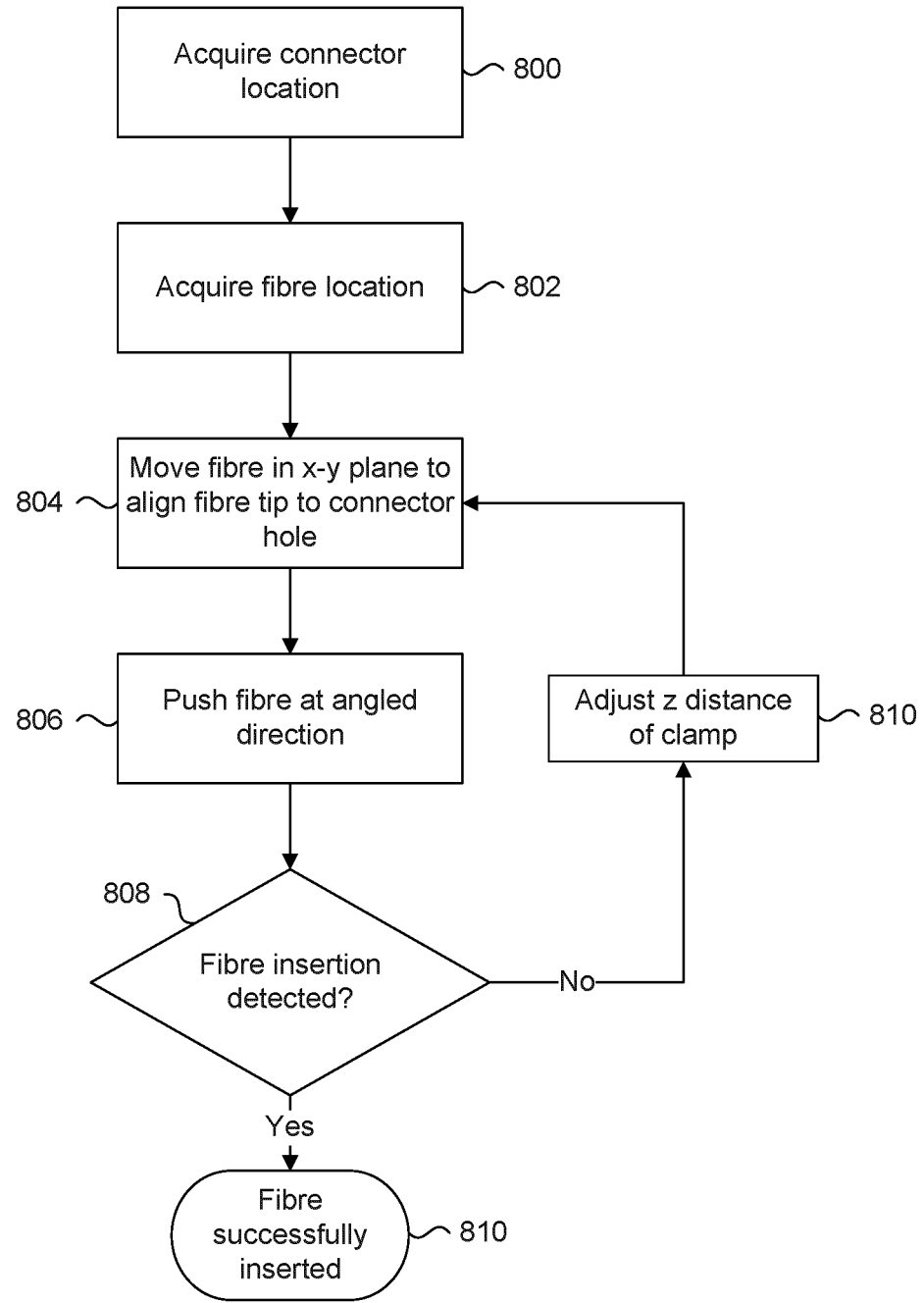
FIG. 8 is a flow chart of a method for automatic insertion of an optical fiber into a optical fiber connector, according to a present embodiment.
Figure 9A:
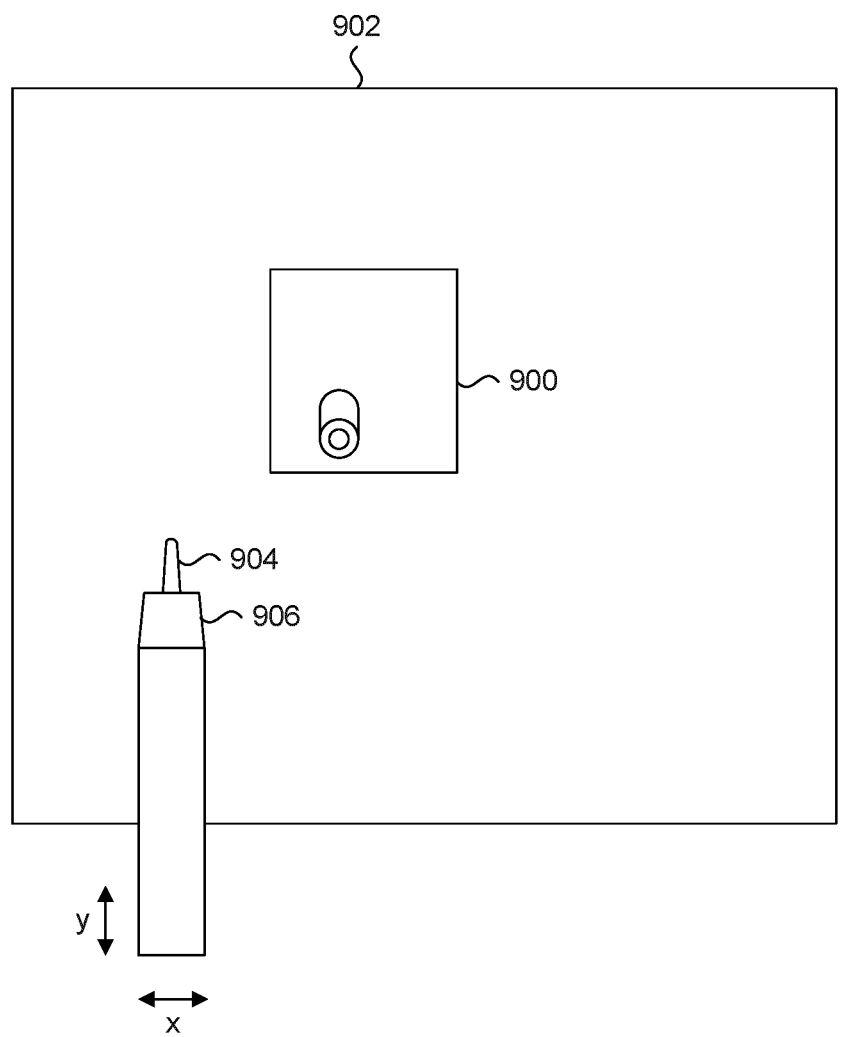
FIG. 9A is a top plan view of a motorized stage and optical fiber clamp.
Figure 9B:
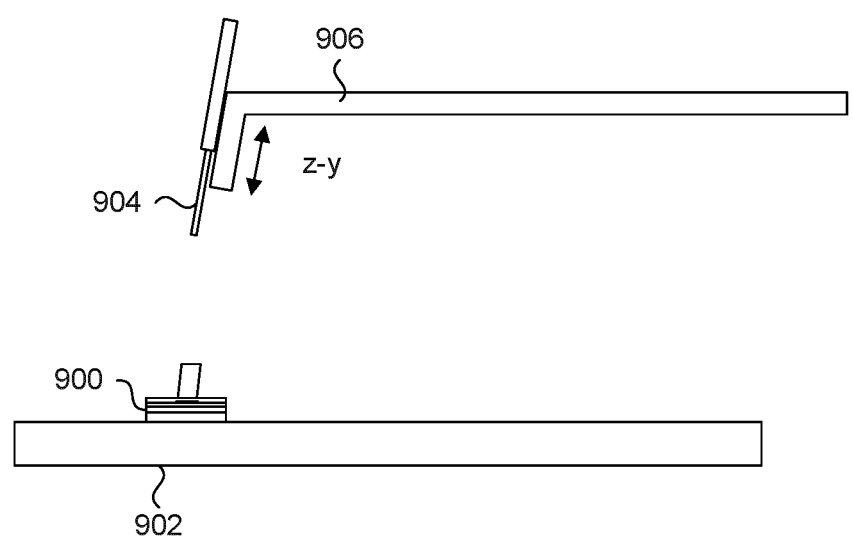
FIG. 9B is a side view of the motorized stage and optical fiber clamp of FIG. 9A.

Prior to execution of the method of FIG. 8, it is first assumed that the chip 900 with formed angled connector is secured to a two dimensional work surface 902 and a stripped optical fiber 904 is held in a clamp 906. The connector and the fiber are oriented to have one dimension be parallel with each other such that the central axis of the connector (of the bore hole) and the axis of the fiber have one common dimension that are parallel. In FIG. 9A by example, the chip 900 is oriented to have the axis of the connector extend in the y-dimension, which is the same direction as the axis of the fiber 904. Furthermore, the bore hole of the connector and the tip of the fiber are oriented to generally face each other. Alignment marks formed on the chip can be used to ensure that the chip is oriented correctly. Once the fiber is in a plane vertical to the chip 900 and tilted at the same angle as the connector, then the fiber can be considered will be fully parallel to the connector. More specifically, the vector of the axis of the connector should be substantially the same as the vector of the axis of the optical fiber. Furthermore, if the fiber tip has been cleaved to have a taper, then the roll angle of the fiber is adjusted such that the flat surface of the cleaved tip is parallel to the surface of the chip 900.

In FIG. 9A, the motorized stage is not shown, but is assumed to be connected to the arm comprising clamp 904. It is assumed that from the top plan view of FIG. 9A, the clamp moves horizontally and vertically, corresponding to the x and y dimensions respectively. The connector and the fiber are positioned in the field of view (FOV) of a digital camera mounted to a microscope (not shown). It is further assumed that the computing system is preprogrammed to recognize a 2D pattern of a round connector, based on shading from a directed light source.

The method starts at 800, where the system searches for the connector shape in the FOV. By example, if the preprogrammed shape is circular and of a particular size, then the system uses its patter recognition algorithm to locate the connector, based on the greyshades resulting from the light source. Pattern recognition algorithms based on grayshade identification is known in the art. Once identified, the x-y coordinates of the connector are logged and a reference image of the connector and surroundings without the fiber in the FOV is captured by the camera and saved. It is understood that the x-y coordinate system has been pre-calibrated for different magnification levels of the microscope.

Following at 802, the optical fiber tip is moved into the FOV at any x-y position and identified within the FOV using the following sub-routine. A current image of the FOV including the connector, its surroundings and the optical fiber tip is captured. The system then subtracts this image from the reference image saved at 800, leaving only the position of the fiber. From this net image, the x-y coordinates of the tip of the fiber can be easily identified and logged, using grayshade pattern recognition techniques.

Following at 804, the system moves the clamp with fiber along the x and y directions with predetermined step sizes until the fiber tip is aligned with the connector hole. This alignment can be considered completed when the centroid of the fiber tip and connector hole are substantially the same.

At this point, the fiber tip should be substantially centered over the connector hole, as shown in FIG. 9B. The z-distance of the fiber tip from the connector is not known, so the iterative steps of 806, 808, 810 and 804 are executed. It is noted that the z-dimension is an example of a dimension orthogonal to the 2 dimensional x-y plane. At 806 the fiber is moved at an angled downward direction downwards the connector. In otherwords, the fiber is moved along a vector corresponding to the angle that intersects the 2 dimensional x-y plane. In the presently shown coordinate system of FIGS. 9A and 9B, the clamp 906 moves in the z-y direction, and the angle corresponds to the angle of the connector. The specific direction the clamp 906 moves depends on the orientation of the chip 900 and clamp angle. For example, the clamp can be configured to move in the z-x direction instead.

Once the clamp has moved a predetermined distance, a determination is made at 808 to check that the fiber has been successfully inserted into the connector. One technique for making this determination is by having the system detect a specific pattern made by the fiber tip refracting light through the walls of the connector. Once again, the previously mentioned pattern recognition algorithm can be configured to do this. Alternately, a sensor connected to the clamp 906 can detect the resistance of the substrate after the clamp has moved a little more than the predetermined full insertion length of the fiber.

If at 808 fiber insertion is not detected, the method proceeds to 810 where the z-distance of the clamp 906 is reduced, as it is assumed that the current z-distance from the connector is too large. This z-distance increment reduction can be set to any step size. Because the clamp has moved in the y-direction, the fiber tip is no longer properly aligned over the connector hole. Therefore the method returns to 804 for x-y realignment, and the steps of 806 and 808 are repeated. It is noted that the system can be configured to detect fiber bumping off the facet of the connector or simply never appearing in the FOV. Assuming the fiber has been successfully inserted into the connector, the method ends at 812.

From this point, an optional automatic adhesive application process can be executed to further secure the fiber in the connector and prevent its accidental slippage out from the connector due to physical shock when in use.

The optional automatic adhesive application is similar to the previously described automatic fiber insertion process, except that a needle is to be positioned over the connector area. For example, once the fiber has been inserted into the connector, a new reference image is captured and saved. A needle for dispensing adhesive is moved into the FOV and a current image is captured and saved. Using the same image subtraction method, the needle position is identified. The system calculates the required x-y displacement for positioning the needle over the connector with inserted fiber, and then squeezes a suitable amount of adhesive using a syringe pump so that the adhesive makes contact with both the connector and the fiber.

To improve coupling, index matching fluid can be added between the fiber and the grating prior to insertion of the fiber so that the inserted fiber has maximum light coupling to the grating. In the presently disclosed embodiments, the automatic alignment of the fiber or the needle can be +/−5 μm, therefore the accuracy is more than sufficient for the present application. While an adhesive is generally described as the agent for bonding or securing the fiber to the connector, any epoxy or other dispensable material having a final effect of bonding the fiber to the connector can be used.

The present disclosure provides an economical, repeatable and efficient coupling between optical fibers and integrated circuits. The connector fabrication can be made at the wafer level using standard fabrication processes, making the technique applicable for high volume production. A system for automated insertion of a fiber into the described connector allows for time and cost efficient assembly of a connector with a fiber.

Although embodiments of the present disclosure had been described in detail, it should be noted that variations of the embodiments can be made without departing from the scope of the disclosure.

The invention claimed is:

1. A semiconductor device comprising including an optical waveguide having a grating coupler, comprising:
   a substrate including:
   a first cladding layer,
   a core layer under the first cladding layer, and
   a second cladding layer under the core layer
   an optical fiber guide connector extending from the first cladding layer and formed at an angle of less than 90 degrees and greater than or equal to 55 degrees relative to a surface of the substrate, the connector defining a bore extending from a top facet of the connector to the surface of the substrate, the connector bore having a shape for receiving and holding an optical fiber at the angle to prevent a received end of the optical fiber from moving over the substrate.

2. The semiconductor device of claim 1, wherein the first cladding layer includes a grating coupler, and the bore of the connector is aligned over the grating coupler.

3. The semiconductor device of claim 1, wherein the bore of the connector is tapered from a top facet of the connector to the first cladding layer.

4. The semiconductor device of claim 3, wherein the connector has a height to width aspect ratio aspect ratio of at least 2:1.

5. The semiconductor device of claim 1, wherein the connector includes two slots extending from the bore to an external wall of the bore.

6. The semiconductor device of claim 1, wherein the connector includes four slots extending from the bore to an external wall of the bore.

7. The semiconductor device of claim 1, wherein the connector is configured to receive an optical fiber ribbon.

8. The semiconductor device of claim 1, wherein the connector is constructed of polymer.

9. The semiconductor device of claim 1, wherein the connector is constructed of a metal material.

* * * * *